United States Patent [19]
Jamal et al.

[11] Patent Number: 5,939,916
[45] Date of Patent: Aug. 17, 1999

[54] PHASE SHIFTER SUITABLE FOR CLOCK RECOVERY SYSTEMS

[75] Inventors: Riyaz Jamal, Nepean; Terrance W. Taraschuk, Ottawa, both of Canada

[73] Assignee: Northern Telecom Limited, Montreal, Canada

[21] Appl. No.: 08/996,763

[22] Filed: Dec. 23, 1997

[51] Int. Cl.⁶ .............................. H03H 11/16; H03H 11/26
[52] U.S. Cl. ...................... 327/231; 327/235; 327/238; 327/254; 327/234
[58] Field of Search .................................. 327/231, 233, 327/234, 235, 236, 238, 269, 270, 274, 276, 283, 254, 255, 258, 259, 295, 298

[56] References Cited

U.S. PATENT DOCUMENTS

| | | | |
|---|---|---|---|
| 3,971,996 | 7/1976 | Motley et al. | 328/155 |
| 4,298,872 | 11/1981 | Rodgers | 343/100 LE |
| 4,607,229 | 8/1986 | Isobe et al. | 328/155 |
| 4,638,190 | 1/1987 | Hwang et al. | 327/237 |
| 4,879,527 | 11/1989 | Geile et al. | 331/1 A |
| 4,953,182 | 8/1990 | Chung | 375/97 |
| 5,045,799 | 9/1991 | Holecek | 328/14 |
| 5,179,348 | 1/1993 | Thompson | 328/14 |
| 5,243,456 | 9/1993 | Hirakata | 359/180 |
| 5,313,154 | 5/1994 | Norris | 324/76.48 |
| 5,338,990 | 8/1994 | Lou | 327/264 |
| 5,455,840 | 10/1995 | Nakauchi et al. | 375/371 |
| 5,550,514 | 8/1996 | Liedberg | 331/1 A |
| 5,559,457 | 9/1996 | Uda et al. | 327/116 |
| 5,573,001 | 11/1996 | Petrofsky et al. | 128/661.01 |
| 5,574,755 | 11/1996 | Persico | 375/295 |
| 5,644,260 | 7/1997 | DaSilva et al. | 327/238 |
| 5,676,147 | 10/1997 | Petrofsky et al. | 128/661.01 |
| 5,802,451 | 9/1998 | Adachi et al. | 455/126 |
| 5,828,257 | 10/1998 | Masleid | 327/276 |
| 5,838,736 | 11/1998 | Thomas et al. | 375/329 |

*Primary Examiner*—Timothy P. Callahan
*Assistant Examiner*—An T. Luu

[57] ABSTRACT

A discrete phase shifter and a method for discrete phase shifting in which an input signal is split into two signals. One of the split signals is phase shifted by a first fixed amount by a first fixed phase shifter cell, and the other split signal is phase shifted by a second fixed amount by a second fixed phase shifter cell. A selector is utilized to select at least one of the two split phase shifted signals and to input these to a vector summer. The vector summer synthesizes an output signal that is phase shifted with respect to the input signal. In this manner, the output signal is discretely phase shifted either by the first fixed amount, the second fixed amount, or, by selecting both of the split signals prior to vector summing, the sum of these amounts. Utilizing an electronically controlled phase shifter cell which is monolithically integratable to achieve the first and second fixed phase shifter cells permits implementation of this discrete phase shifter on a monolithic integrated circuit (MIC) with high gain at high frequencies (e.g. 10 GHz). It may be used in filter-based clock recovery systems.

17 Claims, 4 Drawing Sheets

PHASE SHIFTER SUITABLE FOR CLOCK RECOVERY SYSTEMS

BACKGROUND OF THE INVENTION

This invention relates to a phase shifter, a method for phase shifting, and to a clock recovery system for a non-return to zero data signal.

SONET OC-192 communication systems employ non-return-to-zero (NRZ) pulse code modulation (PCM) to represent binary data. Such a modulation scheme generates a signal with a spectral null at the clock frequency of 9.953 GHz or, nominally, 10 GHz. Two approaches exist for the extraction of a synchronous clock from the data signal at the SONET receiver: a phase-locked loop (PLL) technique and a filter-based (FB) technique.

In a known FB system, the received 10 GHz NRZ signal is processed by a prefilter amplifier and a frequency doubler followed by a narrow bandpass filter centered at the clock frequency. The resulting signal is a clock exhibiting considerable amplitude noise due to the random occurrence of transitions in the NRZ data and the bandpass filter's finite Q-factor. Such a clock signal requires conditioning to remove the amplitude noise and provide phase adjustment over a large fraction of one bit period. The signal conditioning devices include a serially arranged digital phase shifter, an RF amplifier, an analog phase shifter and a driver amplifier. The digital phase shifter comprises p-i-n diode switches to switch one of several different length transmission lines into the RF path. The analog phase shifter comprises varactors and branch line couplers to form reflection phase shifters, a number of which are connected in cascade. The driver amplifier contains a passive p-i-n diode limiter. This structure is expensive and not suited to monolithic integration.

FB techniques currently offer superior jitter performance over PLL techniques but they do so with a large increase in cost and complexity and lower robustness. Furthermore, PLL techniques are amenable to monolithic integration whereas current FB techniques are not. Typically, due to these drawbacks, PLL techniques have been the chosen over FB techniques even though they offer a lower performance.

This invention seeks to provide a phase shifter suitable for use in an FB clock recovery system which overcomes drawbacks attendant with known FB clock recovery systems.

SUMMARY OF INVENTION

According to the present invention, there is provided a discrete phase shifter, comprising: a first fixed phase shifter for shifting a phase of an input signal by a first fixed amount; a second fixed phase shifter for shifting a phase of an input signal by a second fixed amount; a selector for selecting an output of at least one of said first fixed phase shifter and said second fixed phase shifter to form a selected set; and a summer for vector summing said selected set to obtain an output signal shifted in phase from said input signal.

According to another aspect of the present invention, there is provided a method for discrete phase shifting, comprising the steps of: shifting a phase of an input signal by a first fixed amount to obtain a first phase shifted signal; shifting a phase of an input signal by a second fixed amount to obtain a second phase shifted signal; selecting at least one of said first phase shifted signal and said second phase shifted signal to form a selected set; and summing said selected set to obtain an output signal shifted in phase from said input signal.

BRIEF DESCRIPTION OF THE DRAWINGS

In the figures which illustrate preferred embodiments of the invention.

DETAILED DESCRIPTION OF THE PREFERRED EMBODIMENTS

Figure 1:
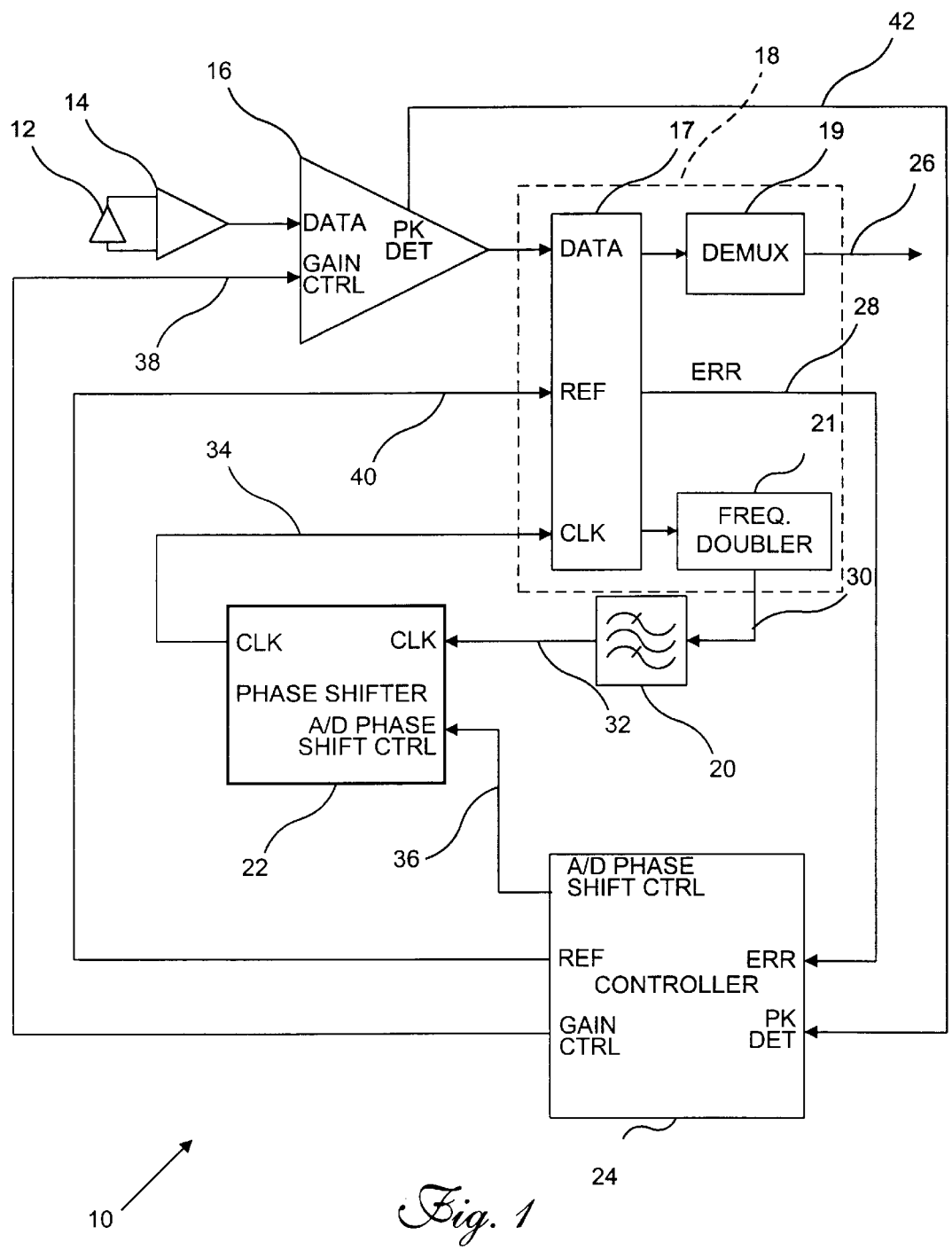
FIG. 1 is a schematic diagram of a clock and data recovery system made in accordance with this invention.

FIG. 1 comprises a clock and data recovery (CDR) circuit 10 for incoming binary non-return-to-zero (NRZ) pulse-code intensity modulated light. The system comprises an optical detector 12, a preamplifier 14, an adjustable gain control (AGC) amplifier 16, a decision circuit 17, demultiplexer 19, and frequency doubler 21 implemented on an integrated circuit (IC) 18, a bandpass filter 20, a phase shifter 22, and a controller 24. The preamplifier 14 outputs to the AGC amplifier 16 which, in turn, outputs to the decision circuit 17. The AGC amplifier 16 also outputs a peak detect signal (PK DET) on path 42 to the controller 24. The PK DET signal is proportional to the amplitude of the signal that is output by the AGC amplifier 16 to decision circuit 17. The decision circuit outputs to the demultiplexer 19 and frequency doubler 21 and, as well, outputs "pseudo-error" signals (ERR) on path 28 to controller 24. The demultiplexer 19 outputs on data path 26 and the frequency doubler 21 outputs on path 30 to the bandpass filter 20. The bandpass filter outputs on path 32 to the phase shifter 22 and the phase shifter outputs clock signals (CLK) on path 34 to the decision circuit. The controller outputs phase shift control signals on path 36 to the phase shifter 22, gain control signals on path 38 to the AGC amplifier, and reference signals (REF) on path 40 to the decision circuit 17.

At a system level, the operation of the CDR system is as follows. Optical detector 12 detects incoming binary NRZ pulse-code intensity modulated light and converts the data bearing optical signal to a data bearing electrical signal and passes same to preamplifier 14 where it is amplified. The signal is then passed to AGC amplifier 16 where it is further amplified by an amount dependent upon gain control signals received on path 38 from controller 24. The controller 24 uses the PK DET signal received on path 42 from the AGC amplifier 16 to adjust the gain control signals in order to maintain the PK DET signal level at a constant, maximum level. The further amplified signal then inputs the decision circuit 17 of IC 18. The decision circuit, with the aid of reference level control signals from the controller on path 40 specifies the data input level which constitutes a binary "1" state versus a binary "0" state and, being clocked by clock path 34, constructs a data stream based on this "slicing level". The data stream is demultiplexed to 8-bit words by the demultiplexer 19 and output on path 26. The frequency doubler 21 doubles the frequency of the bit stream output from the decision circuit and outputs the frequency doubled signal to bandpass filter 20 on path 30. The bandpass filter passes the portion of the signal which is at the clock frequency to the phase shifter 22 on path 32.

As will be appreciated by those skilled in the art, with a return-to-zero data stream, the stream transitions to zero at the end of each data bit. This makes recovery of the clock a simple matter of detecting the transitions. However, with a non-return-to-zero data stream, the stream only transitions where a binary "1" bit is followed by a binary "0" bit, or vise versa. In consequence, there may be a number of consecutive bits with no transitions. The frequency doubler facilitates clock recovery with an NRZ data signal as the doubled frequency signal will have a greater number of transitions at the clock frequency and, hence, a larger proportion of the data signal will express the clock frequency. The bandpass filter then filters out the doubled frequency component while retaining a signal component which now better expresses the clock frequency.

The "rough" clock signal output by the bandpass filter on path 32 is then phase shifted by the phase shifter 22 by an amount dependent upon phase shift control signals on path 36 from the controller 24 in order to provide a refined clock signal which is output on path 34. This refined clock signal inputs the decision circuit 17 of IC 18 where it is used to clock same in recovering the data bit stream from the data signal.

The pseudo-error signals on path 28 are generated by the decision circuit based on a comparison of the data signal levels and the levels of the reference control signals. The controller 24 uses the pseudo-error signals to determine a signal-to-noise (SNR) ratio. The controller then uses this SNR indication to adjust the level of the reference signals to improve the SNR as much as possible. A preferred manner of generating pseudo-error signals and adjusting the level of reference signals in response thereto is described in U.S. Pat. No. 4,823,360 to Tremblay, the disclosure of which is incorporated by reference herein.

Figure 2:
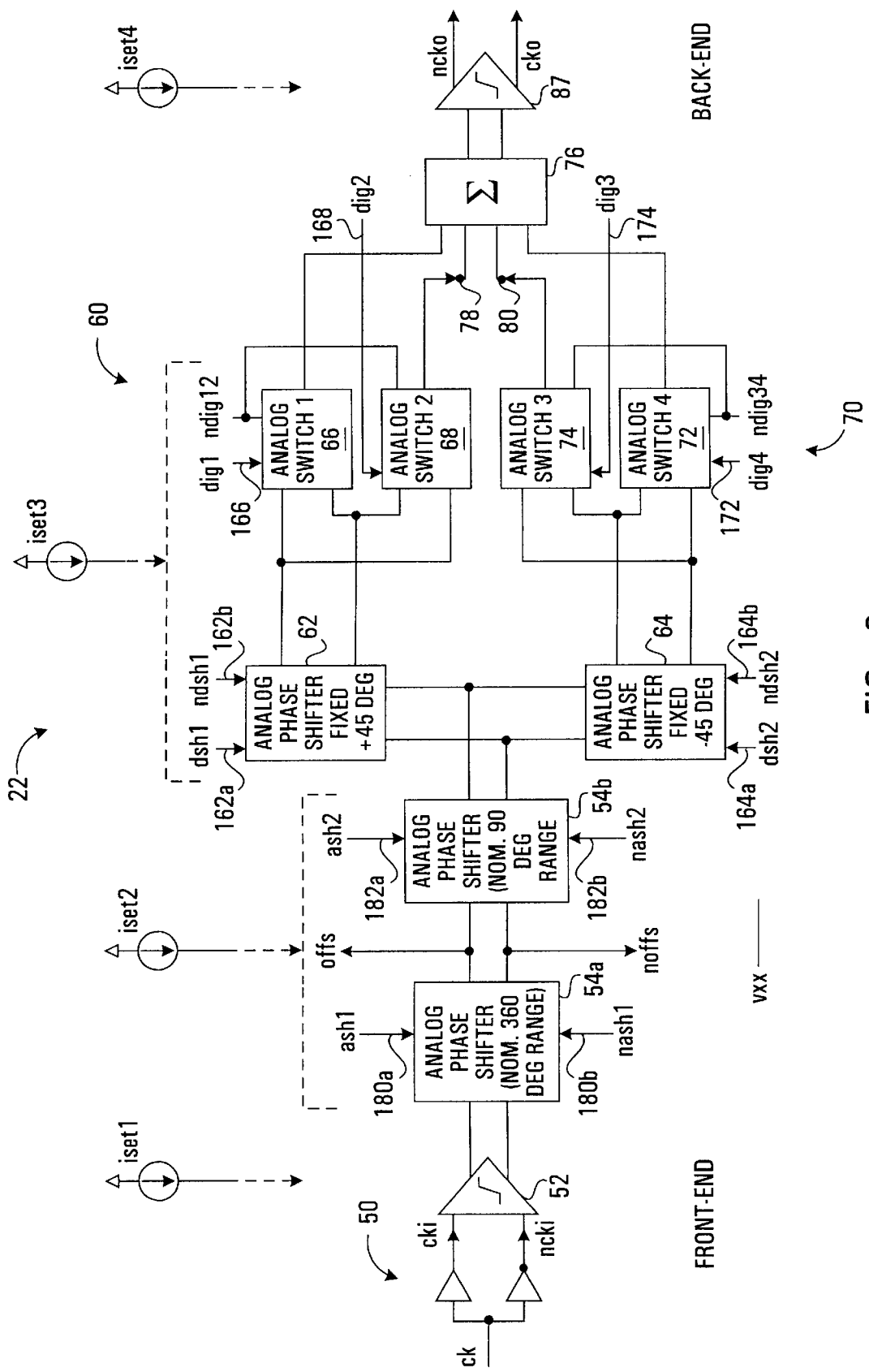
FIG. 2 is a schematic diagram of a portion of FIG. 1.

The phase shifter is detailed in FIG. 2. Turning to FIG. 2, the phase shifter comprises a splitter and inverter 50 for deriving a differential clock signal from the clock signal arriving from the bandpass filter. The differential clock signal inputs a front-end limiting amplifier 52; the front-end amplifier inputs a cascaded series of variable phase shifters indicated at 54a and 54b. Preferably block 5a comprises four cascaded variable phase shifters and block 54b one further cascaded variable phase shifter with each variable phase shifter imparting a phase shift to a signal inputting it of between 0 and 90 degrees. The cascaded variable phase shifters 54a, 54b output to a discrete phase shifter indicated generally at 60. The discrete phase shifter comprises a first fixed phase shifter 62 which is input with the differential signal output by the cascaded variable phase shifters and a second fixed phase shifter 64 which is also input with the differential signal output by the cascaded variable phase shifters. The first fixed phase shifter outputs to switches 66 and 68 of a selector indicated generally at 70 and the second fixed phase shifter outputs to switches 72 and 74 of selector 70. All of the switches have differential outputs inputting summer 76, but the differential outputs of switches 68 and 74 input summer 76 through inverters 78, 80, respectively. Each of the switches 66, 68, 72, 74 is controlled by a control line 166, 168, 172, 174, respectively, from the phase shift control path 36 of the controller 24 (FIG. 1) to switch between a position whereat it connects its differential input to its differential output and a position whereat it disconnects its differential input from its differential output. The summer 76 outputs a differential signal to back-end limiting amplifier 87, which outputs a differential refined clock signal.

Figure 3:
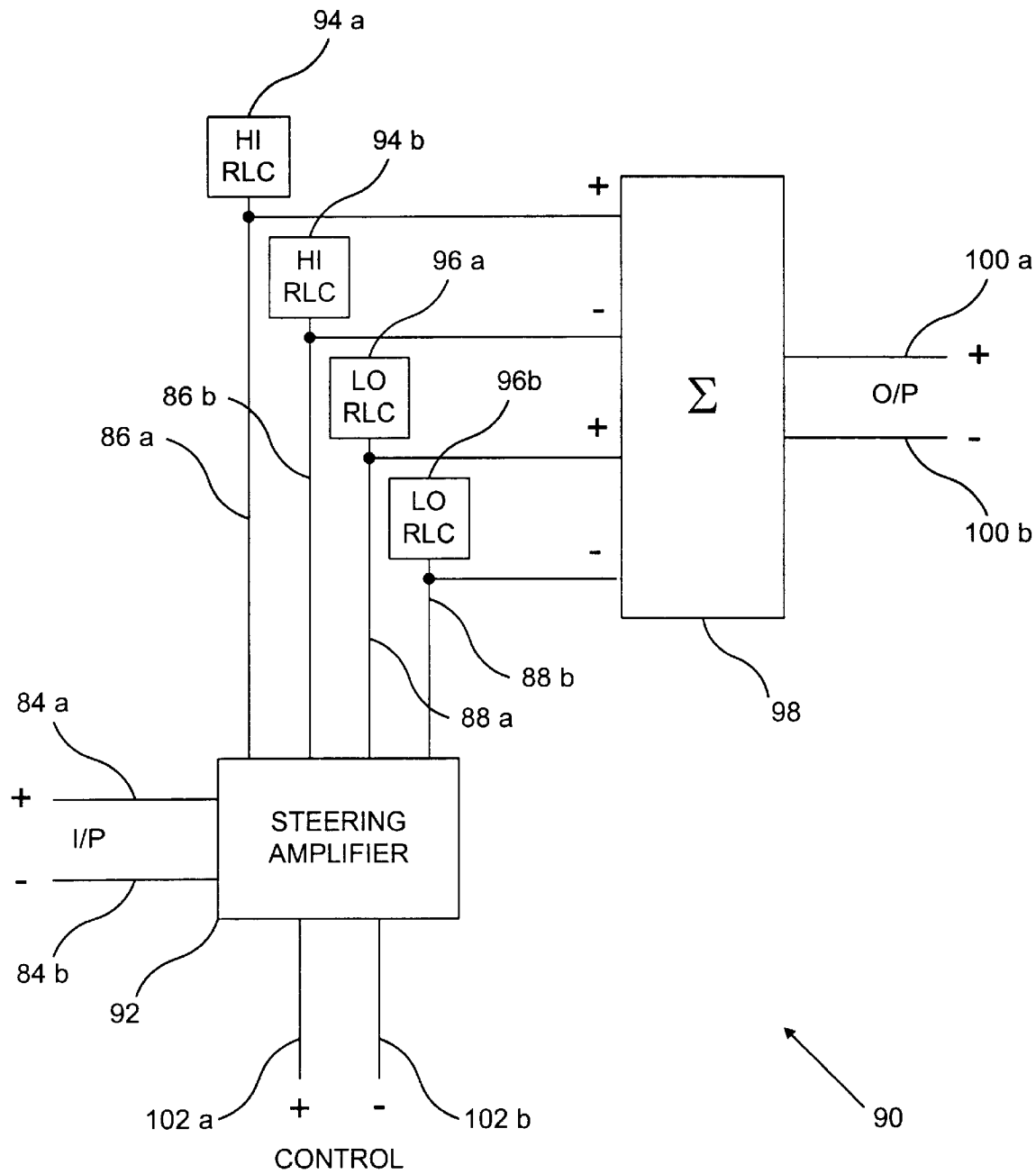
FIG. 3 is a schematic diagram of a portion of FIG. 2.

Each of the cascaded variable phase shifters and each of the fixed phase shifters are fabricated as a phase shifting cell 90 shown in FIG. 3. Phase shifting cell 90 comprises a steering amplifier 92 fed with differential input lines 84a, 84b and having differential output lines 86a, 86b loaded with resistor inductor capacitor (RLC) networks 94a, 94b, respectively, and differential output lines 88a, 88b loaded with RLC networks 96a, 96b, respectively. RLC networks 94a and 94b are tuned to a frequency above that of the clock frequency and RLC networks 96a, 96b are tuned to a frequency below that of the clock frequency. All of the output lines input summer 98 which sums the signal on line 86a with line 88a placing the sum on output line 100a and sums line 86b with line 88b placing the sum on output line 100b. The steering amplifier is also input with differential control lines 102a, 102b. Further detail regarding phase shifting cell 90 is provided in an application filed at the U.S. Patent and Trademark Office on December, 1997 entitled ELECTRONIC PHASE SHIFTER listing Steven McGarry, Bruce Beggs and Riyaz Jamal as inventors, attorney docket number 91436-61, the contents of which are incorporated by reference herein.

Each of the switches 66, 68, 72, 74 of selector 70 are preferably implemented as a differential pair amplifier which is driven to pass an input signal to its output or to shut off based on a control signal from the controller. Summer 76 as well as the summer 98 (FIG. 3) of phase shifting cell 90 are also preferably implemented as differential pair amplifiers.

With each of the variable and fixed phase shifters comprised of the phase shifting cell of FIG. 3 and each of the switches and summers comprised of differential pair amplifiers, the phase shifter 22 may readily be fabricated as a monolithic IC. Further, by fabricating such an IC from GaAs utilising heterojunction bipolar transistors (HBTs), the IC is adapted for high frequency applications such as clock recovery for a SONET OC-192 communication system.

Returning to FIG. 1, the phase shift control path 36 from the controller 24 to the phase shifter 22 comprises the differential control lines to each of the variable and fixed phase shifters of the phase shifter 22. Referencing FIG. 2, during fabrication of the CDR circuit 10, the differential control lines 162a, 162b of fixed phase shifter 62 are permanently set to provide a fixed phase shift of +45 degrees and the differential control lines 164a, 164b of fixed phase shifter 64 are permanently set to provide a fixed phase shift of −45 degrees.

Figure 4:
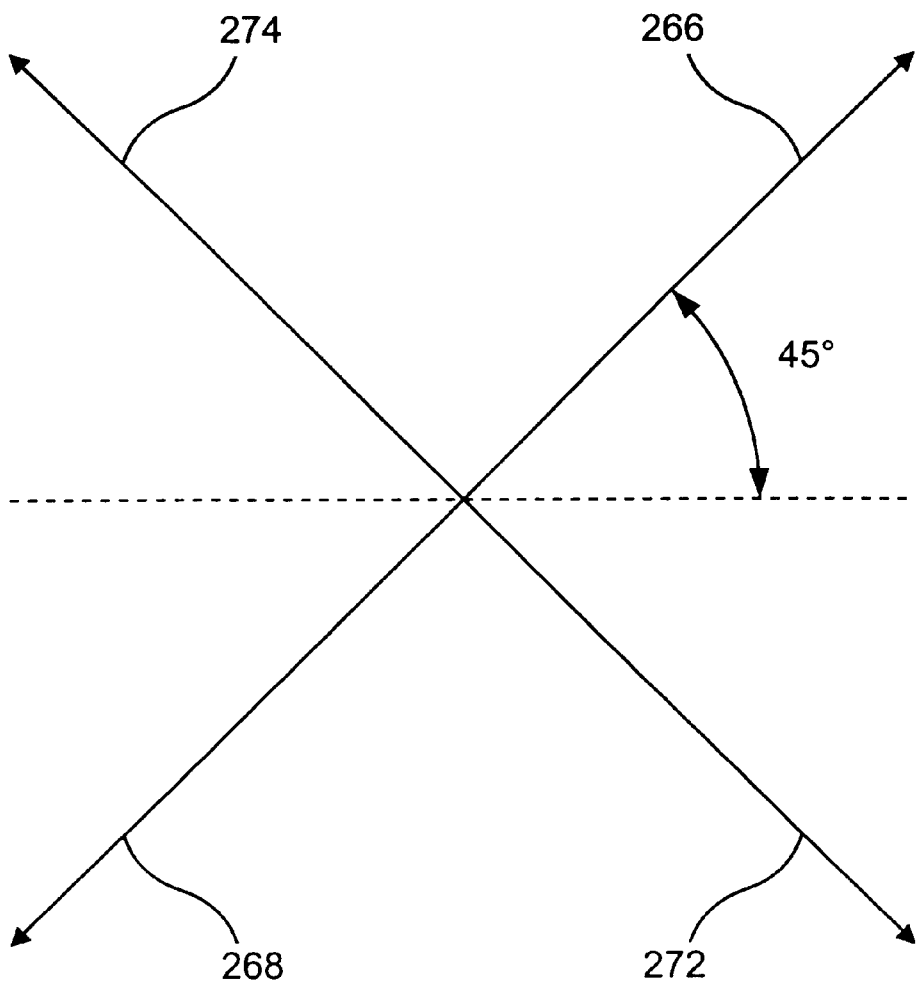
FIG. 4 is a phasor diagram relating to the operation of a portion of a system made in accordance with this invention.

Referring to FIG. 4, assuming a 0° reference input signal to the fixed phase shifters, the non-inverted outputs of switches 66, 68, 72, and 74 may be represented by phasors 266, 268, 272, and 274, respectively. When a switch is closed, this phasor is passed to the summer 76 (FIG. 2) for vector summing. It will therefore be apparent that by closing selected ones of the switches a phase shift of the signal output from the discrete phase shifter with respect to the signal input to the discrete phase shifter may be set at 0 degrees, +/−45 degrees, +/−90 degrees, +/−135 degrees, or 180 degrees representing eight discrete phase shift states.

Referring to FIG. 1 along with FIG. 2, after fabrication of the CDR circuit 10, a pseudo-random data bit stream is input directly to the AGC amplifier 16 by a pattern generator (not shown) at a high SNR. One of the eight discrete phase shift states is then chosen. The analog phase shift control signals on differential control lines 180a, 180b of cascaded variable phase shifters 54a and those on differential control lines 182a, 182b of variable phase shifter 54b (all of which are received on path 36) are next swept to sweep the phase change imparted by the cascaded variable phase shifters over their entire phase shift range. The resulting data errors are monitored so that the valid data window (i.e., the range of phase changes imparted by the variable phase shifters which results in acceptable data recovery) can be determined. This procedure is repeated for all eight discrete phase shift states. Then the discrete state which results in a valid data window centered closest to the median phase change of the variable phase shifters is chosen and set as a factory pre-set for the fixed phase shifters. In view of manufacturing tolerances, the chosen discrete phase shift state may differ from fabricated CDR circuit to fabricated CDR circuit. This factory setting compensates for phase delays inherently imparted by a particular CDR circuit.

Referencing FIG. 1 along with FIG. 2, after the appropriate factory setting for the discrete phase shifter 60, the phase shifter 22 operates as follows in the recovery of a clock signal. The "rough" clock signal received from the bandpass filter 20 (FIG. 1) is converted to a differential signal by splitter and inverter 50. The differential rough clock signal then inputs front-end limiting amplifier 52. The limiting amplifier functions to remove amplitude modulation (AM) from the rough clock signal. The circuit topology is optimized to provide maximum amplitude modulation to phase modulation (AM-PM) rejection in order to minimize clock jitter. This limiting function is confined to the front-end circuit since the analog phase shifter, when implemented as a steering amplifier, exhibits low AM-PM rejection.

The SNR determined by the controller 24 in response to the pseudo-error signals is also used by the controller to determine a phase shift to impart to the clock signals in an effort to improve this SNR. To effect the phase shift, the controller sends a control signal of equal magnitude to each variable phase shifter cell of the cascaded variable phase shifters 54a, 54b. The magnitude of the control signal is chosen so that, assuming five cascaded variable phase shifter cells in all, each of the variable phase shifters imparts a phase change of one-fifth of the phase change determined by the controller. After cascading, the controller determined phase shift then appears at the output of the last cascaded variable phase shifter 54b. The clock signal then propagates through the discrete phase shifter which imparts the factory set phase shift to the clock. Lastly, the signal inputs the back-end limiting amplifier 78 which maintains the output signal level at a consistent level. By way of explanation, it is noted that the gain imparted to the clock signal in the phase shifter varies dependent upon the phase shift which is actually imparted to the signal (due to signal summing through the cascaded variable phase shifters and at the summer of the discrete phase shifter). With the limiting amplifier, the output signal level can be raised, if necessary, so that it is always the same no matter what phase shift is currently being imparted by the phase shifter 22.

While the preferred embodiment has been described in conjunction with two fixed phase shifters in the discrete phase shifter each imparting a 45 degree phase shift, of course a greater number of fixed phase shifters (with two switches for each additional fixed phase shifter) may be employed with each fixed phase shifter set to impart a smaller phase shift in order to improve the accuracy of the phase shift nulling of the discrete phase shifter. For example, four fixed phase shifters could be employed, each imparting a 22½ degree phase shift to the signal. As well, of course a different number of cascaded variable phase shifters may be employed.

Other modifications will be apparent to those skilled in the art and, therefore, the invention is defined in the claims.

What is claimed is:

1. A discrete phase shifter, comprising:
   a first fixed phase shifter for shifting a phase of an input signal by a first fixed amount;
   a second fixed phase shifter for shifting a phase of said input signal by a second fixed amount;
   a selector for selecting an output of at least one of said first fixed phase shifter and said second fixed phase shifter to form a selected set; and
   a summer for vector summing said selected set to obtain an output signal shifted in phase from said input signal.

2. The discrete phase shifter of claim 1 wherein:
   said input signal comprises a differential pair of input signals such that one of said pair is inverted with respect to another of said pair;
   said first fixed phase shifter for shifting a phase of said differential pair by said first fixed amount such that said first fixed phase shifter has a differential pair of outputs, one of said differential pair of outputs inverted with respect to the other;
   said second fixed phase shifter for shifting a phase of said differential pair by said second fixed amount such that said second fixed phase shifter has a differential pair of outputs, one of said second phase shifter differential pair of outputs inverted with respect to the other.

3. The discrete phase shifter of claim 2 wherein said first fixed phase shifter comprises a steering amplifier loaded with resistor inductor capacitor circuits and input with a first fixed phase control signal and wherein said second fixed phase shifter comprises a steering amplifier loaded with resistor inductor capacitor circuits and input with a second fixed phase control signal.

4. The discrete phase shifter of claim 1 wherein said selector comprises a first switch for selectively coupling an output of said first fixed phase shifter to said summer and a second switch for selectively coupling an output of said second fixed phase shifter to said summer.

5. The discrete phase shifter of claim 2 wherein said selector comprises a first switch for selectively coupling said differential pair of outputs of said first fixed phase shifter to said summer and a second switch for selectively coupling said differential pair of outputs of said second fixed phase shifter to said summer.

6. The discrete phase shifter of claim 5 wherein said selector further comprises a third switch and an inverter for selectively coupling an inverted form of said differential pair of outputs of said first fixed phase shifter to said summer and a fourth switch and an inverter for selectively coupling an inverted form of said differential pair of outputs of said second fixed phase shifter to said summer.

7. The discrete phase shifter of claim 2 including a limiting amplifier coupled to the output of said summer.

8. A discrete phase shifter, comprising:
   means for shifting a phase of said input signal by a first fixed amount;
   means for shifting a phase of an input signal by a second fixed amount;
   means for selecting an output of at least one of said first fixed phase shifter and said second fixed phase shifter to form a selected set; and
   means for vector summing said selected set to obtain an output signal shifted in phase from said input signal.

9. A phase shifter comprising:
   at least two cascaded variable phase shifters, each variable phase shifter for shifting a phase of a signal input to said each variable phase shifter by a variable amount;
   a first fixed phase shifter for shifting a phase of a signal output by said cascaded variable phase shifters by a first fixed amount;
   a second fixed phase shifter for shifting a phase of said signal output by said cascaded variable phase shifters by a second fixed amount;

a selector for selecting an output of at least one of said first fixed phase shifter and said second fixed phase shifter to form a selected set; and a summer for vector summing said selected set to obtain an output signal shifted in phase from said input signal.

10. The phase shifter of claim 9 wherein each said phase shifter comprises an amplifier and including a limiting amplifier for removing amplitude modulation from said signal input.

11. The phase shifter of claim 10 including a limiting amplifier for imparting a gain to a signal output from said summer.

12. A clock and data recovery system for a non-return-to-zero data signal, comprising:

at least two cascaded variable phase shifters responsive to a form of said data signal, each variable phase shifter for shifting a phase of a signal input to said each variable phase shifter by a variable amount;

a first fixed phase shifter for shifting a phase of a signal output by said cascaded variable phase shifters by a first fixed amount;

a second fixed phase shifter for shifting a phase of said signal output by said cascaded variable phase shifters by a second fixed amount;

a selector for selecting an output of at least one of said first fixed phase shifter and said second fixed phase shifter to form a selected set; and a summer for vector summing said selected set to obtain a clock signal for recovering said data signal.

13. The clock recovery system of claim 12 wherein each said phase shifter comprises an amplifier and including a limiting amplifier for imparting a gain to a signal inputting said cascaded variable phase shifters such that each said phase shifter is driven into saturation.

14. The clock recovery system of claim 13 including a limiting amplifier for imparting a gain to a signal output from said summer.

15. The clock recovery system of claim 12 including:

a frequency multiplier input with said data signal;

a bandpass filter centered at a clock frequency responsive to an output of said frequency multiplier and outputting to said limiting amplifier.

16. The clock recovery system of claim 13 including a controller for determining the signal-to-noise ratio of data recovered by said clock signal and for, responsive to said signal-to-noise ratio, sending a phase shifting control signal to each of said cascaded variable phase shifters in order to improve said signal-to-noise ratio.

17. A method for discrete phase shifting, comprising the steps of:

shifting a phase of an input signal by a first fixed amount to obtain a first phase shifted signal;

shifting a phase of said input signal by a second fixed amount to obtain a second phase shifted signal;

selecting at least one of said first phase shifted signal and said second phase shifted signal to form a selected set; and summing said selected set to obtain an output signal shifted in phase from said input signal.

* * * * *

UNITED STATES PATENT AND TRADEMARK OFFICE
CERTIFICATE OF CORRECTION

PATENT NO. : 5,939,916
DATED : August 17, 1999
INVENTOR(S) : Riyas Jamal et al.

It is certified that error appears in the above-identified patent and that said Letters Patent is hereby corrected as shown below:

In column 6, line 48, replace "means for shifting a phase of said input signal by a first" with --means for shifting a phase of an input signal by a first--.

In column 6, line 50, replace "means for shifting a phase of an input signal by a second" with --means for shifting a phase of said input signal by a second--.

Signed and Sealed this

Second Day of May, 2000

Attest:

Q. TODD DICKINSON

Attesting Officer

Director of Patents and Trademarks